(12) United States Patent
Morianz et al.

(10) Patent No.: US 10,332,818 B2
(45) Date of Patent: Jun. 25, 2019

(54) EFFICIENT HEAT REMOVAL FROM COMPONENT CARRIER WITH EMBEDDED DIODE

(71) Applicant: AT & S Austria Technologie & Systemtechnik Aktiengesellschaft, Leoben (AT)

(72) Inventors: Mike Morianz, Graz (AT); Gerald Weis, St. Marein im Mürztal (AT); Johannes Stahr, St. Lorenzen (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/880,055

(22) Filed: Jan. 25, 2018

(65) Prior Publication Data
US 2018/0211899 A1 Jul. 26, 2018

(30) Foreign Application Priority Data
Jan. 26, 2017 (EP) ..................................... 17153329

(51) Int. Cl.
*H01L 23/34* (2006.01)
*H01L 23/367* (2006.01)
(Continued)

(52) U.S. Cl.
CPC ...... *H01L 23/3675* (2013.01); *H01L 21/4853* (2013.01); *H01L 21/4857* (2013.01); *H01L 21/4871* (2013.01); *H01L 23/367* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/072* (2013.01); *H05K 1/0203* (2013.01); *H05K 1/185* (2013.01); *H05K 3/30* (2013.01); *H05K 3/4644* (2013.01); *H01L 2223/6677* (2013.01); *H01L 2224/04105* (2013.01); *H01L 2224/06181* (2013.01); *H01L 2224/12105* (2013.01); *H01L 2224/16227* (2013.01); *H01L 2224/214* (2013.01);
(Continued)

(58) Field of Classification Search
CPC . H01L 23/36; H01L 23/3736; H01L 23/3737; H01L 23/5389; H01L 25/072
USPC .......................................... 257/724; 438/109
See application file for complete search history.

(56) References Cited

U.S. PATENT DOCUMENTS 7,042,086 B2 * 5/2006 Shimoida .............. H01L 25/071
257/723
8,916,968 B2 * 12/2014 Mahler ............. H01L 21/76816
257/691
(Continued)

FOREIGN PATENT DOCUMENTS

| CN | 102570857 A | 7/2012 |
|---|---|---|
| DE | 102014113518 A1 | 4/2015 |
| EP | 0949745 A1 | 10/1999 |

*Primary Examiner* — Nitin Parekh
(74) *Attorney, Agent, or Firm* — Robert A. Blaha; Smith Tempel Blaha LLC

(57) ABSTRACT

A component carrier has an interconnected stack with at least one electrically insulating layer structure and/or at least one electrically conductive layer structure, a component embedded in the stack and a diode, and at least one heat removal layer configured for removing heat from the diode and substantially fully covering a whole main surface of the component carrier.

13 Claims, 4 Drawing Sheets

(51) Int. Cl.

| | | |
|---|---|---|
| *H01L 23/538* | (2006.01) | |
| *H01L 23/00* | (2006.01) | |
| *H01L 25/07* | (2006.01) | |
| *H01L 21/48* | (2006.01) | |
| *H05K 1/02* | (2006.01) | |
| *H05K 1/18* | (2006.01) | |
| *H05K 3/30* | (2006.01) | |
| *H05K 3/46* | (2006.01) | |
| *H02M 7/06* | (2006.01) | |

(52) U.S. Cl.
CPC ............... *H01L 2224/24226* (2013.01); *H01L 2224/32225* (2013.01); *H01L 2224/73267* (2013.01); *H01L 2224/82047* (2013.01); *H01L 2924/12031* (2013.01); *H01L 2924/12036* (2013.01); *H01L 2924/14* (2013.01); *H01L 2924/1431* (2013.01); *H01L 2924/1461* (2013.01); *H01L 2924/19041* (2013.01); *H01L 2924/19042* (2013.01); *H01L 2924/19043* (2013.01); *H01L 2924/19105* (2013.01); *H02M 7/06* (2013.01); *H05K 2201/015* (2013.01); *H05K 2201/0141* (2013.01); *H05K 2201/0154* (2013.01); *H05K 2201/10174* (2013.01)

(56) References Cited

U.S. PATENT DOCUMENTS

| | | | |
|---|---|---|---|
| 9,023,688 B1* | 5/2015 | Or-Bach | H01L 23/3677 |
| | | | 257/E21.532 |
| 2011/0193491 A1 | 8/2011 | Choutov et al. | |
| 2011/0255250 A1* | 10/2011 | Dinh | G03B 15/03 |
| | | | 361/749 |
| 2014/0151856 A1 | 6/2014 | Otremba et al. | |
| 2015/0092375 A1 | 4/2015 | Otremba et al. | |
| 2015/0243640 A1 | 8/2015 | Horio et al. | |
| 2016/0079156 A1 | 3/2016 | Liu et al. | |
| 2016/0126210 A1* | 5/2016 | Standing | H01L 25/50 |
| | | | 257/706 |
| 2016/0352246 A1* | 12/2016 | Lai | H02M 7/003 |
| 2016/0365333 A1* | 12/2016 | Hohlfeld | H01L 23/3672 |
| 2017/0110978 A1* | 4/2017 | Lai | H01L 23/36 |

* cited by examiner

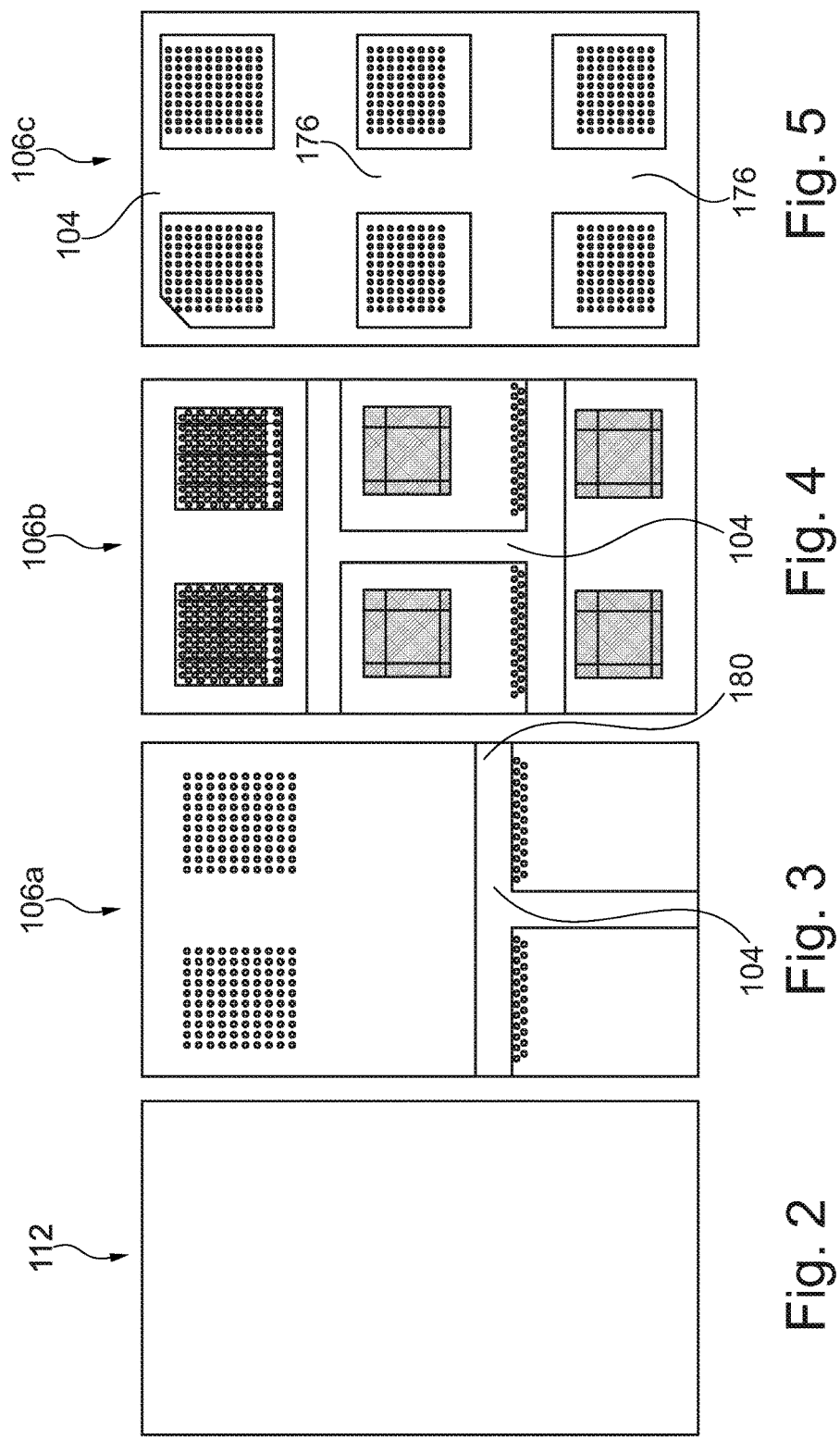

US 10,332,818 B2

EFFICIENT HEAT REMOVAL FROM COMPONENT CARRIER WITH EMBEDDED DIODE

CROSS-REFERENCE TO RELATED APPLICATION

This application claims the benefit of the filing date of the European Patent Application No. 17153329.2 filed 26 Jan. 2017, the disclosure of which is hereby incorporated herein by reference.

TECHNICAL FIELD

The invention relates to a method of manufacturing a component carrier, to a component carrier, and to an electronic device.

BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

In particular, efficient operation of an embedded diode in a component carrier is a challenge.

SUMMARY

There may be a need to embed a diode component in a component carrier in a way to allow for an efficient and reliable operation.

In order to achieve this need, a method of manufacturing a component carrier, a component carrier, and an electronic device according to the independent claims are provided.

According to an exemplary embodiment of the invention, a component carrier is provided, wherein the component carrier comprises an interconnected (in particular a laminated) stack comprising at least one (in particular a plurality of) electrically insulating layer structure and/or at least one (in particular a plurality of) electrically conductive layer structure, a component embedded in the stack and comprising a diode, and at least one heat removal layer (which may also be denoted as heat conducting layer or heat sink layer or heat transport layer) configured for removing heat from the diode and fully or substantially fully covering a whole main surface of the component carrier.

According to another exemplary embodiment of the invention, an electronic device is provided, wherein the electronic device comprises a coupling structure, and a component carrier having the above-mentioned features and mechanically connected with (for instance mounted on and/or below and/or within) the coupling structure so that the diode is electrically coupled to the coupling structure.

According to still another exemplary embodiment of the invention, a method of manufacturing a component carrier is provided, wherein the method comprises forming an interconnected stack comprising at least one electrically insulating layer structure and/or at least one electrically conductive layer structure, embedding a component, which comprises a diode, in the stack, and fully or substantially fully covering a whole main surface of the component carrier by at least one heat removal layer configured for removing heat from the diode.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In the context of the present application, the term "diode" may particularly denote a two-terminal electronic component that conducts primarily in one direction (i.e. has an asymmetric conductance). A diode may have a low (preferably zero) resistance to the flow of electric current in one direction, and high (preferably infinite) resistance in the opposing other direction. A semiconductor diode may be a crystalline piece of semiconductor material with a p-n junction connected to two electrical terminals. A diode may be implemented for the purpose of rectifying an electric current. Advantageously, a wide bandgap semiconductor material may be used for manufacturing a semiconductor-based diode. Materials such as silicon, silicon carbide or group III-group V semiconductors may be used as a basis for manufacturing a diode.

In the context of the present application, the term "component comprising a diode" may particularly denote an electronic component which provides a diode function. In one embodiment, the component comprising a diode may consist of a diode, i.e. does not provide other electronic functions than that of a diode. In another embodiment, the component comprises a diode and at least one further electronic element such as a further diode, a transistor, etc. The component comprising a diode may be configured as a naked die or a package with such a die. The diode component may also be a naked diode die embedded in a component carrier laminate such as a printed circuit board. In such an embodiment, the component carrier (for instance embodied as a larger printed circuit board) according to an exemplary embodiment may be composed of the interconnected stack having one or more recesses in which one or more smaller component carriers with embedded diode may be embedded as diode component. Thus, the component carrier according to an exemplary embodiment may also be carried out in a board-in-board configuration. For instance, the diode may be manufactured in semiconductor technology (like silicon technology or silicon carbide technology). Alternatively, the component comprising a diode may also be provided as an electronic member which is not manufactured in semiconductor technology. For example, the diode(s) or diode circuit composed of multiple such diodes may be configured in accordance with an electric operating voltage of up to 600 V, in particular of up to 1200 V.

In the context of the present application, the term "heat removal layer" may particularly denote a continuous layer (which may be a single layer, a double layer, or a layer composed of at least three sub layers) of thermally conductive material forming one exterior main surface of the plate-shaped component carrier. Thereby, the at least one heat removal layer may for instance cover at least 40% of the entire exterior surface of the component carrier. The at least one heat removal layer may be made of a material of high thermal conductivity, in particular at least 3 W/mK. Preferably, the at least one heat removal layer may be configured as an electrically insulating material compatible with component carrier manufacturing technology (in particular PCB technology) and at the same time having a high thermal conductivity, such as copper or thermal prepreg with highly thermally conductive filler particles or the like.

In the context of the present application, the term "substantially fully covering a whole main surface" may particularly denote the fact that almost an entire or at least a major portion of the main surface is formed or covered by the at least one heat removal layer. For instance, at least 90%, in particular at least 95% of the main surface can be covered with the at least one heat removal layer. Only one or more minor portions may remain uncovered, for instance a portion having a through hole for guiding a fastening element (such as a screw) therethrough or a small edge portion of the main surface.

According to an exemplary embodiment of the invention, one or more diode components may be embedded in a component carrier stack of interconnected layer structures. Such an embedded provision of a diode component in component carrier material (in particular PCB material such as dielectric resin-based sheets with reinforcing particles, and electrically conductive copper structures) allows for an efficient manufacture of the component carrier with integrated diode function during component carrier manufacturing. At the same time, the diode component is mechanically protected within the interconnected stack. However, efficient removal of heat generated by the one or more embedded diode components during operation of the component carrier may be an issue in view of the frequently only moderate heat removal capability of the dielectric material of the interconnected stack. Exemplary embodiments however overcome this shortcoming by providing at least one heat removal layer which forms approximately one entire whole main surface of the component carrier. By providing one or more exterior continuous heat removal layers with highly thermally conductive characteristics on substantially an entire main surface of the component carrier, a large external thermal exchange area is provided. The at least one heat removal layer can be thermally coupled with the embedded diode component to thereby efficiently remove and spread heat generated by the diode component. Such heat may be dissipated via the full external heat removal layer(s) of the component carrier. Highly advantageously, in particular electrically conductive component carrier materials such as copper are highly appropriate to function as heat removal layer(s) and are fully compatible with component carrier manufacturing processes.

In the following, further exemplary embodiments of the method, the component carrier and the electronic device will be explained.

In an embodiment, the component is a semiconductor chip, in particular a naked semiconductor chip, in which the diode is monolithically integrated. Semiconductor chips are capable of providing a powerful diode function in a compact way. In particular the use of a naked, i.e. non-packaged, semiconductor die as diode component allows to manufacture the component carrier in a particular flat and therefore compact way.

In an embodiment, the component comprises a cathode pad, in particular on one main surface of the component, and an anode pad, in particular on an opposing other main surface of the component. The cathode pad may be configured for enabling an electric connection of one or more electrically conductive layer structures of the interconnected stack to the cathode of the diode. Correspondingly, the anode pad may be configured for enabling an electric connection of one or more electrically conductive layer structures of the interconnected stack to the anode of the diode. Preferably, one or both of cathode pad and anode pad is or are made of copper enabling a connection with copper material of the one or more electrically conductive layer structures of the interconnected stack. A particularly advantageous embodiment of the diode component may be the provision of a naked semiconductor die with an integrated diode and copper pads on opposing main surfaces thereof.

In an embodiment, the cathode pad covers the entire main surface of the component. Additionally or alternatively, the anode pad covers only part of the opposing other main surface of the component. Configuring the cathode pad as an electrically conductive layer fully covering one main surface of the diode component allows to contact the cathode with low ohmic resistance and a proper heat removal coupling towards the at least one heat removal layer. In order to properly connect (electrically and thermally) also the anode pad without continuously covering the entire lower main surface of the diode component, it is possible to provide multiple vertical through connections (such as micro-vias) for contacting the anode pad.

In an embodiment, the cathode pad and the anode pad comprise or consist of a metal, preferably copper. This allows to properly connect (mechanically, electrically and thermally) the mentioned pad with electrically conductive material of the interconnected stack which is also preferably made of copper.

In an embodiment, the component carrier comprises a plurality of components, in particular exactly four components, embedded in the stack and each comprising a respective diode. The multiple components, of which at least two may be diode components, may be interconnected electrically by the electrically conductive layer structures of the interconnected stack.

In an embodiment, the components are electrically connected to form a rectifier bridge. Such a rectifier bridge or diode bridge may be an arrangement of two, four or more) diodes (in particular provided as four diode components) in a bridge circuit configuration that provides the same polarity of output for either polarity of input. When used for conversion of an alternating current (AC) input into a direct current (DC) output, such a diode circuit may be denoted as a rectifier bridge (see also FIG. 9). Such a rectifier bridge may be implemented in an electronic device which can for instance be a mains adapter for a laptop or a mobile phone.

In an embodiment, the components are located coplanar. The interconnected components may be embedded in a coplanar way in the component carrier so as to obtain a flat component carrier with implemented electronic diode or diode based (for example rectifying) function with or without significant increase of the thickness of the obtained component carrier.

In an embodiment, the at least one electrically conductive layer structure comprises a first electrically conductive layer structure which is arranged spaced with regard to an electrically conductive layer, as one of the at least one heat removal layer, by an electrically insulating and thermally conductive layer, as another one of the at least one heat removal layer. The electrically insulating and thermally conductive layer may provide an electrical isolation between the rectifying diode(s) and a cooling body attached to the exterior heat removal layer. The first electrically conductive layer structure may contribute to the electric connection of the at least one diode component, in particular may electrically couple multiple diode components. By sandwiching the electrically insulating and thermally conductive heat removal layer between the first electrically conductive layer structure and the exterior, in particular metallic, heat removal layer, any undesired electric coupling between the exterior heat removal layer and the first electrically conductive layer structure may be safely prevented. By taking this measure, the material of the exterior thermally conductive heat removal layer can be freely selected for optimizing its heat removal and heat spreading function. In particular, taking this measure enables the outermost heat removal layer to be made from an electrically conductive material. This is advantageous due to the fact that many highly thermally conductive materials are also electrically conductive. By allowing the implementation of such a highly thermally conductive and electrically conductive heat removal layer on an exterior surface of the component carrier and by sandwiching the thermally conductive and electrically insulating heat removal layer in between the electrically conductive heat removal layer and the first electrically conductive layer structure, both the thermal and the electric performance and reliability of the component carrier may be improved. The thermally conductive and electrically insulating heat removal layer closes a thermal path from the diode component(s) via the first electrically conductive layer structure up to the electrically insulating heat removal layer.

In an embodiment, the first electrically conductive layer structure directly electrically contacts an entire first main surface of the component, in particular comprises a plurality of sections each directly electrically contacting an entire first main surface of a respective one of the plurality of components. Therefore, the one or more diode components may be located relatively close to the exterior heat dissipating main surface of the component carrier with proper thermal connection thereto. When contacting multiple, in particular all first main surfaces of the components by a common (in particular patterned) first electrically conductive layer structure, a simple and compact configuration may be achieved.

In an embodiment, a second electrically conductive layer structure is arranged spaced with regard to the first electrically conductive layer structure by the component and one of the at least one electrically insulating layer structure. The second electrically conductive layer structure, which may be configured as a patterned metal foil as well, may fulfill the task of contacting a second (in particular lower) main surface of the one or more components in an efficient way. By interposing an electrically insulating layer structure between the first and the second electrically conductive layer structures, their electric decoupling can be safely ensured.

In an embodiment, the second electrically conductive layer structure electrically contacts only a part of a second main surface of the component, in particular comprises a plurality of sections each electrically contacting a respective part of the second main surface of a respective one of a plurality of components. In particular, the component carrier may comprise a plurality of electrically conductive first vertical interconnect structures (such as micro-vias, inlays, posts or pillars) bridging or directly contacting both the second electrically conductive layer structure and the part of the second main surface of the component. Access holes to be filled with electrically conductive material (such as plated copper) for forming the first vertical-interconnect structures may for example be manufactured by laser drilling, mechanically drilling or etching.

In an embodiment, the component carrier comprises at least one electrically conductive second vertical-interconnect structure bridging or directly contacting both the first electrically conductive layer structure and the second electrically conductive layer structure. The second vertical-interconnect structure may vertically extend between the first and second electrically conductive layer structures and may therefore extend through the same plane as the one or more diode components. In particular, the second vertical-interconnect structure may be composed of one or more vertically extending electrically conductive structures providing a short connection between the first and second electrically conductive layer structures. This keeps electric losses low and promotes a compact configuration of the component carrier. For example, the second vertical-interconnect structures may be micro-vias, inlays, posts or pillars, for instance made of copper.

In an embodiment, the component carrier comprises a third electrically conductive layer structure forming at least part of another main surface of the component carrier opposing the main surface formed by the at least one heat removal layer. In particular, the third electrically conductive layer structure may be a patterned layer, for instance a patterned copper foil. This third electrically conductive layer structure forms part of the second main surface of the component carrier opposed to the first main surface of the component carrier which is preferably constituted by the at least one heat removal layer only. By such a provision of the third electrically conductive layer structure on the lower main surface of the component carrier, the heat removal and heat spreading capability of the component carrier is further improved. At the same time, the third electrically conductive layer structure provides an electric function when it is electrically conductively coupled to the (in particular anode pad(s) of the) diode component(s).

In an embodiment, the third electrically conductive layer structure is a patterned electrically conductive layer composed of a plurality of electrically decoupled separate islands. Each island may serve as an exterior pad of the component carrier to be connected with the coupling structure (such as a further PCB) electrically and mechanically. Such a connection may for instance be accomplished by soldering, in particular by soldering the islands with electrically conductive structures of the coupling structure via solder paste, solder balls, etc.

In an embodiment, the component carrier comprises a plurality of electrically conductive third vertical-interconnect structures bridging or directly contacting both the second electrically conductive layer structure and the third electrically conductive layer structure. For example, the third vertical-interconnect structures may be micro-vias, inlays, posts or pillars, for instance made of copper.

In an alternative embodiment, it is possible to substitute the second electrically conductive layer structure and the third electrically conductive layer structure interconnected by the third vertical-interconnect structures by a single electrically conductive layer structure. This enables a particularly compact configuration.

In an embodiment, at least one of the first vertical-interconnect structures, the at least one second vertical-interconnect structure and the third vertical-interconnect structures comprise at least one of the group consisting of a metal filled laser drill hole, a metal filled mechanical drill hole, a metallic inlay, and a micro-via. Drilling may be accomplished for example by laser processing or mechanically processing. Metal filling of the so manufactured holes may be carried out by plating, in particular galvanic plating.

In an embodiment, the component carrier comprises solder material on the third electrically conductive layer structure. For instance, the solder material may be solder paste or solder bumps so that the component carrier can be simply assembled on a coupling structure (such as a further printed circuit board or a mother board) by establishing a solder connection.

In an embodiment, the at least one heat removal layer comprises or consists of an electrically conductive material (in particular having a value of thermal conductivity of at least 50 W/mK, in particular at least 100 W/mK, more particularly at least 400 W/mK. In particular, the at least one heat removal layer may comprise or consist of a material of the group consisting of copper, aluminum, diamond-like carbon, graphene, highly thermally conductive prepreg, and a resin filled with thermally highly conductive filler particles.

In an embodiment, the at least one heat removal layer comprises or consists of an electrically insulating material having a value of thermal conductivity of at least 3 W/mK, in particular at least 5 W/mK, more particularly at least 10 W/mK.

In one embodiment, the at least one heat removal layer is an electrically conductive layer only (for instance a copper foil, see reference numeral 112 in FIG. 1). In another embodiment, the at least one heat removal layer is an electrically insulating layer only (for instance a thermal prepreg, see reference numeral 118 in FIG. 1). In yet another embodiment, the at least one heat removal layer comprises an electrically conductive layer and an electrically insulating layer (see reference numerals 112, 118 in FIG. 1). In the latter embodiment, it is particularly advantageous when the electrically conductive heat removal layer is the exterior layer (since this allows soldering of a metallic heat sink body) and the electrically insulating heat removal layer is the interior layer (since this allows to electrically decouple the central electronic functionality from the exterior of the component carrier) of the double layer, wherein however also the alternative arrangement as possible.

On average, the at least one heat removal layer may have an average value of thermal conductivity of at least 3 W/mK, in particular at least 20 W/mK, more particularly at least 100 W/mK.

In an embodiment, the electrically conductive layer (as one of the at least one heat removal layer) may have a higher thermal conductivity than the electrically insulating and thermally conductive layer (as another one of the at least one heat removal layer). It is also possible that the electrically insulating and thermally conductive heat removal layer may have a higher thermal conductivity than the remaining electrically insulating layer structure(s). For instance, the electrically insulating and thermally conductive layer may comprise or consist of a material having a value of thermal conductivity of at least 3 W/mK, in particular at least 5 W/mK, more particularly at least 10 W/mK.

In an embodiment, the electronic device is configured as a mains adapter. An AC/DC adapter or domestic mains adapter may be used for battery-powered equipment, such as chargers or rechargers. Such a mains adapter may be used with an electronic device that requires power but does not contain internal components to derive the required voltage and power from mains power. In another embodiment, the electronic device is configured as a rectifier, a DC/DC converter (or DC/DC module) and/or a power electronic device.

In an embodiment, the electronic device comprises a heat sink body thermally coupled to electrically conductive material (for instance copper) at a top of the heat transport layer. For example, such a heat sink body may be a thermally highly conductive plate provided with cooling fins. Such a heat sink body may be connected or attached to the at least one heat removal layer so as to dissipate the heat removed by the at least one heat removing layer from the one or more diode components towards an environment.

In an embodiment, the coupling structure is selected from a group consisting of a further component carrier on which the component carrier is mounted, a further component mounted on the component carrier, and a further component carrier in which the component carrier is embedded. Thus, the component carrier may be mounted on a further component carrier (such as a printed circuit board) as a coupling structure and a mounting base (compare for example FIG. 1). Alternatively, the component carrier may constitute a mounting base (and may function similarly as an IC substrate) on which a further component (such as a semiconductor chip or a semiconductor package) is mounted (compare for example FIG. 7). In yet another exemplary embodiment, a board-in-board configuration may be provided in which the component carrier is embedded within another component carrier (such as another printed circuit board), compare for example FIG. 8.

In an embodiment, the diode is electrically coupled to the coupling structure at a main surface of the component carrier opposed to the at least one heat removal layer. Thus, a heat removal surface and electric interface of the component carrier may be arranged on opposing main surfaces thereof. Different functions may therefore be spatially decoupled.

At least one further component may be surface mounted on or embedded in the component carrier. The at least one further component can be selected from a group consisting of an electrically non-conductive inlay, an electrically conductive inlay (such as a metal inlay, preferably comprising copper or aluminum or a metal such as aluminum coated with copper), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite coupling structure) or may be a paramagnetic element. However, the component may also be a further component carrier, for example in a board-in-board configuration. The component may be surface mounted on the component carrier and/or may be embedded in an interior thereof. Moreover, also other components may be used as a component or components of assemblies.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as a component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the component carrier is a compound of multiple layer structures which are stacked and connected together by applying a pressing force, if desired accompanied by heat.

The aspects defined above and further aspects of embodiments of the invention are apparent from the examples of embodiment to be described hereinafter and are explained with reference to these examples of embodiment.

BRIEF DESCRIPTION OF THE DRAWINGS

FIG. 2, FIG. 3, FIG. 4 and FIG. 5 illustrate views of various planes of the component carrier according to FIG. 1.

DETAILED DESCRIPTION OF EXEMPLARY EMBODIMENTS

Figure 1:
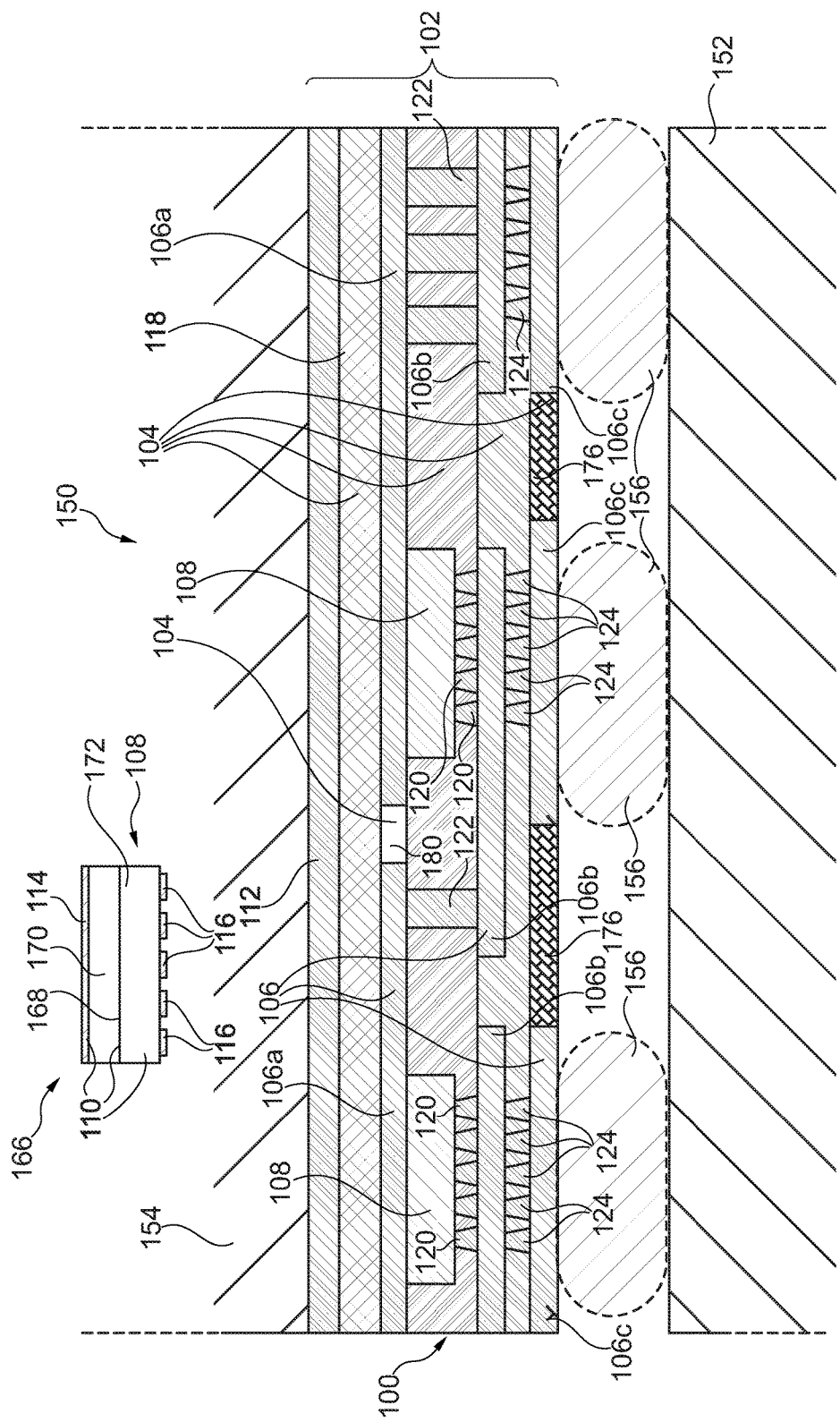
FIG. 1 illustrates a cross-sectional view of an electronic device comprising a component carrier according to an exemplary embodiment of the invention.

Before, referring to the drawings, exemplary embodiments will be described in further detail, some basic considerations will be summarized based on which exemplary embodiments have been developed.

According to an exemplary embodiment of the invention, a component carrier is provided in which a diode bridge is embedded in laminate material, in form of an interconnected stack, of the component carrier. The diode bridge may be thermally highly efficiently coupled to an exterior of the component carrier by a heat removal layer covering substantially one entire main surface of the component carrier (or of the interconnected stack thereof).

The diode component(s) may be embedded in and galvanically connected using electrically conductive layer structures such as micro-vias, slits, and/or full area layers. One full thermally conductive exterior main surface in form of a heat removal layer may take care of the spreading and removal of heat generated by the one or more diode components during operation. This prevents undesired overheating of the component carrier during operation. With embodiments of the invention, the switching behavior of the component carrier with embedded diode function may be significantly improved due to the low parasitic inductance which can be obtained with such a construction, while simultaneously a proper heat dissipation can be ensured thanks to the heat removal layer. By embedding the diode component(s) in the laminated stack of component carrier material, the diode component(s) is or are properly protected against undesired corrosion. The interconnected stack serves as a protection against moisture and other undesired influences from the environment. Therefore, the component carrier with embedded diode function is mechanically reliable and compact, has a proper thermal performance, has an advantageous low ohmic and low inductance configuration thus enabling low losses upon switching, and can be manufactured with reduced effort.

FIG. 1 illustrates a cross-sectional view of an electronic device 150 comprising a plate-shaped flat component carrier 100 according to an exemplary embodiment of the invention. FIG. 2 to FIG. 5 illustrate views of various electrically conductive layer structures 106 of the component carrier 100 according to FIG. 1.

Figure 9:
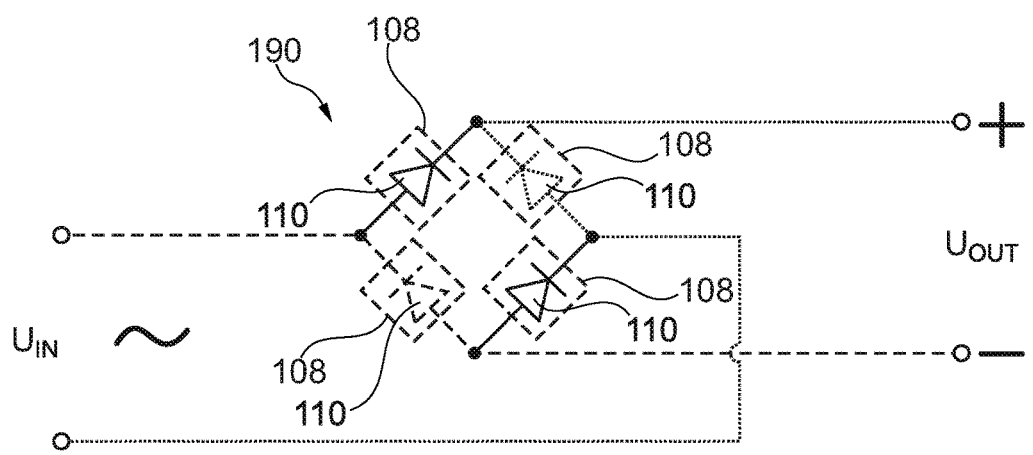
FIG. 9 is a circuit diagram of a rectifier bridge composed of four interconnected diode components according to the embodiment of FIG. 1 and configured for converting an alternating voltage into a direct voltage.

The electronic device 150 shown in FIG. 1 is configured as a mains adapter (which however can also be embodied as rectifier for other power electronic devices like a DC/DC module) with rectifier bridge function (see the circuit diagram of FIG. 9). The electronic device 150 comprises a coupling structure 152 which can be embodied for example as a printed circuit board (PCB). Moreover, the electronic device 150 comprises the PCB-type component carrier 100 mounted on and thereby mechanically and electrically connected with the coupling structure 152. As a result, a circuitry of diodes 110 embedded in the component carrier 100 is electrically coupled to the coupling structure 152 via solder bumps 156 electrically and mechanically connecting the component carrier 100 with the coupling structure 152. As can be taken from FIG. 1, the connection between the component carrier 100 and the coupling structure 152 is formed at a lower main surface of the component carrier 100 opposing an upper main surface of the component carrier 100 at which a continuous electrically conductive heat removal layer 112 (which may also be denoted as heat conducting layer or heat sink transport layer) is exposed to an environment for heat dissipation. In addition, a further continuous electrically insulating heat removal layer 118 (which can be made of a highly thermally conductive prepreg) is provided below the electrically conductive heat removal layer 112. Thereby, a double layer composed of the two heat removal layers 112, 118 is formed, wherein the exterior electrically conductive heat removal layer 112 is made of a metallic material allowing a solder connection for connecting a metallic heat sink body 154 onto the component carrier 100. The interior electrically insulating heat removal layer 118 may be made of a dielectric material allowing for an electric decoupling between the electronic circuitry in an interior of the component carrier 100 and the exterior electrically conductive heat removal layer 112.

As will be described below in further detail, the electrically conductive heat removal layer 112 and the electrically insulating heat removal layer 118 serve for dissipating heat generated by the diodes 110 during operation of the electronic device 150. In order to further promote heat removal via the electrically conductive heat removal layer 112 and electrically insulating heat removal layer 118, it is optionally possible to attach or solder and thermally couple heat sink body 154 to the electrically conductive heat removal layer 112. Although only shown schematically in FIG. 1, the heat sink body 154 may be made of a thermally conductive plate with a plurality of spaced cooling fins integrally formed with the plate. Additionally or alternatively, the heat sink body 154 may be a housing which can be heated up or can be a heat pipe connected by soldering or the like. Thereby, the heat generated by the diodes 110 during operation of the component carrier 100 may be guided by a thermally conductive path within the component carrier 100 via the electrically insulating heat removal layer 118 up to the electrically conductive heat removal layer 112, from there to the heat sink body 154, and finally to an environment.

In the following, the construction of the component carrier 100 will be explained in detail.

The component carrier 100 comprises a laminated stack 102 composed of multiple electrically insulating layer structures 104 and multiple electrically conductive layer structures 106. The electrically insulating layer structures 104 may be made of dielectric PCB materials such as resin (in particular epoxy resin) with reinforcing particles (in particular glass fibers) therein. Before lamination, material of the electrically insulating layer structures 104 may be at least partially uncured, so that it may become flowable by the application of heat and/or pressure during lamination. Thereby, the material of the electrically insulating layer structures 104 significantly contributes to the interconnection of the various constituents of the component carrier 100. The electrically conductive layer structures 106 may comprise at least one continuous metal layer and/or at least one patterned metal layer and/or at least one metallic vertical interconnect. The metal layers may for example be embodied as copper foils. The vertical interconnect may be for instance embodied as copper filled vias, metallic inlays, etc.

Multiple (in the described embodiment exactly four, although only two are shown in FIG. 1) components 108 may be embedded in the stack 102. As can be taken from FIG. 1, all components 108 are located coplanar, i.e. in one and the same horizontal plane. In the shown embodiment, in which the component carrier 100 provides a rectifier bridge function, four components 108 may be provided, each comprising a respective diode 110. However, only two of the components 108 are visible in FIG. 1. The components 108 and therefore the diodes 110 are electrically interconnected in accordance with a rectifier bridge circuitry by the electrically conductive layer structures 106.

During operation of the component carrier 100, a significant amount of heat is generated by the diodes 110 which exerts thermal stress to the component carrier 100. In order to at least partially remove such ohmic heat, heat removal layers 112, 118 made of thermally highly conductive material are provided fully covering the whole or entire upper main surface of the component carrier 100. Thus, the electrically conductive heat removal layer 112 and the electrically insulating heat removal layer 118 are both continuous layers (or form a continuous double layer) with high thermal conductivity for removing or dissipating heat from the diodes 110 out of the component carrier 100. For instance, the electrically conductive heat removal layer 112 may be a continuous copper layer.

As can be taken from a detail 166 in FIG. 1, each of the components 108 may be embodied as a naked semiconductor chip in which the diode 110 is monolithically integrated. More specifically, the diode 110 may be functionally formed by a p-n-junction 168 between a cathode 170 and an anode 172. Furthermore, each of the components 108 comprises a cathode pad 114 made of copper and electrically contacting the cathode 170. Beyond this, each of the components 108 comprises multiple anode pads 116 made of copper and contacting the anode 172. The cathode pad 114 is provided to cover the upper main surface of the component 108 entirely. The anode pads 116 are provided as separate islands covering only part of an opposing lower main surface of the respective component 108. Thus, the cathode pads 114 cover the entire here upper main surfaces of the respective components 108, whereas the anode pads 116 cover only parts of the opposing other, i.e. here lower, main surface of the respective components 108.

FIG. 1 illustrates that an uppermost first electrically conductive layer structure 106a of the electrically conductive layer structures 106 is arranged spaced with regard to the electrically conductive heat removal layer 112 by the electrically insulating heat removal layer 118 configured as an electrically insulating and thermally conductive layer (embodied as a full layer). The fact that layer 118 is thermally conductive promotes heat transfer from the components 108 to the electrically conductive heat removal layer 112 via the electrically insulating heat removal layer 118. The fact that layer 118 is electrically insulating electrically decouples the electrically conductive heat removal layer 112 (which is preferably made of copper due to its high thermal conductivity and proper compatibility with PCB manufacturing requirements) from the first electrically conductive layer structure 106a. This allows the latter to contribute to the electrical circuitry of the rectifier bridge without any danger that the exposed electrically conductive heat removal layer 112 disturbs this electric functionality. For example, the electrically insulating and thermally conductive heat removal layer 118 may be made of a thermal prepreg, i.e. a prepreg material having a higher thermal conductivity than an ordinary prepreg (of which for instance the other electrically insulating layer structures 104 may be made). The highly thermally conductive prepreg material used for this purpose can be, for example, any epoxy type of resin compound with fillers (such as alumina, conductive carbon fiber, etc.). Preferably, the highly thermally conductive prepreg material may have a thermal conductivity of at least 3 W/mK, for instance of at least or exactly 5 W/mK. Preferably, the electrically insulating and thermally conductive heat removal layer 118 may have a higher value of thermal conductivity than all remaining electrically insulating layer structures 104 of the component carrier 100.

In order to accomplish a low ohmic electric coupling between the components 108 and a proper thermal coupling to the heat removal layers 112, 118, the first electrically conductive layer structure 106a directly electrically contacts the entire upper or first main surfaces of the components 108. For this purpose, the first electrically conductive layer structure 106a comprises a plurality of sections each directly electrically contacting an entire first main surface of a respective one of the plurality of components 108. Individual ones of these sections may be spaced by electrically insulating spacers 180. The spacers 180 (which may for instance be provided as a paste) may ensure an isolating distance between the polarities and may be useful in case that a resin flow during lamination is not sufficient for reliably ensuring an electric decoupling between the sections of the first electrically conductive layer structure 106a.

A second electrically conductive layer structure 106b of the electrically conductive layer structures 106 is arranged below the first electrically conductive layer structure 106a and spaced with regard to the first electrically conductive layer structure 106a by the components 108 and one of the electrically insulating layer structures 104. The second electrically conductive layer structure 106b, which is embodied as a patterned copper foil as the first electrically conductive layer structure 106a, electrically contacts only a portion of a second main surface of the components 108. More specifically, a plurality of sections of the second electrically conductive layer structure 106b each electrically contact a respective portion of the respective second main surface of a respective one of the plurality of components 108.

A plurality of first vertical interconnect structures 120, here embodied as copper filled laser vias, directly contact and thereby electrically couple both the second electrically conductive layer structure 106b and the anode pads 116 on the second main surface of the components 108.

Second vertical-interconnect structures 122, here embodied as copper-filled mechanically drilled holes or inlays or pillars made of copper, directly contact and thereby electrically couple both the first electrically conductive layer structure 106a and the second electrically conductive layer structure 106b. The second vertical-interconnect structures 122 traverse the electrically insulating layer structure 104 in which also the components 108 are embedded. Thus, the second vertical-interconnect structures 122 are arranged also in the common plane of the components 108 and laterally between adjacent ones of the components 108. This enables a compact configuration and short current paths, which in turn results in a low ohmic and low parasitic inductance configuration.

Moreover, a third electrically conductive layer structure 106c of the electrically conductive layer structures 106 forms part of the other lower main surface of the component carrier 100 opposing the main surface formed by the electrically conductive heat removal layer 112 (or, in an embodiment in which no electrically conductive exterior heat removal layer 112 is provided, the electrically insulating heat removal layer 118). In the shown embodiment, the third electrically conductive layer structure 106c is a patterned electrically conductive layer, in particular a patterned copper foil, composed of a plurality of electrically decoupled separate islands. Between adjacent ones of the islands, electrically insulating spacers 176 (which may form a solder mask) are provided for electrically decoupling the various islands.

Beyond this, a plurality of third vertical-interconnect structures 124, here embodied as copper filled laser vias, are provided which directly contact and thereby electrically couple both the second electrically conductive layer structure 106b and the third electrically conductive layer structure 106c.

With the embodiment according to FIG. 1, a rectifier bridge composed or consisting of four diodes 110 embedded in the laminated stack 102 is provided. Four electrically conductive layers are provided, the uppermost forming heat removal layer 112 and the three lower ones forming the electrically conductive layer structures 106 for interconnecting the diodes 110 and providing an electric interface with regard to an electronic periphery of the component carrier 100. The complete exterior electrically conductive heat removal layer 112 on top is provided for heat dissipation together with the electrically insulating heat removal layer 118. The electrically conductive layer structures 106 are electric functional layers. The lowermost third electrically conductive layer structure 106c serves for soldering the component carrier 100 as an SMD (Surface Mounted Device) member on coupling structure 152. The electric contacts of the components 106 are formed on a top main surface thereof over its full area directly by first electrically conductive layer structure 106a and are formed on a bottom main surface thereof over only part of its area by second electrically conductive layer structure 106b via micro-vias or slits as the first vertical-interconnect structures 120. The second electrically conductive layer structure 106b, in turn, is connected to the lowermost third electrically conductive layer structure 106c by the third vertical interconnect structures 124. A further electric connection is accomplished between the second electrically conductive layer structure 106b and the first electrically conductive layer structure 106a by means of filled through holes, compare second vertical-interconnect structures 122.

The component carrier 100 shown in FIG. 1 provides the electronic function of a rectification of an electric current due to the arrangement of the diodes 110 of the components 108. The component carrier 100 is mechanically reliable due to the lamination of the components 108 in an interior of the component carrier material stack 102. The flat configuration of the component carrier 100 renders it compact, which is further promoted by the use of naked dies as the components 108 according to FIG. 1. Due to the provision of the full area electrically conductive heat removal layer 112 which is properly thermally connected with and electrically decoupled from the components 108 via the electrically insulating and thermally conductive heat removal layer 118, the component carrier 100 shows a proper thermal performance. The latter effect is further enhanced by the short thermal path provided by the flat component carrier 100 with its vertical interconnects. In addition, the short electric paths of the vertically compact component carrier 100 as well as the relatively large metal areas by which the components 108 are connected to the electrically conductive layer structures 106 advantageously enable a low ohmic and low inductance configuration. Thus, low losses are encountered or imposed by switching. Since the electric connection and the mechanical embedding of the components 108 in the component carrier material of stack 102 can be provided by applying component carrier manufacturing techniques, the manufacture of the component carrier 100 can be made with low effort.

Referring to FIG. 2, a plan view of the layer corresponding to the electrically conductive heat removal layer 112 is illustrated. FIG. 2 shows that the electrically conductive heat removal layer 112 may be a continuous uninterrupted full surface area covering layer.

Referring to FIG. 3, a plan view of the layer corresponding to the first electrically conductive layer structure 106a is illustrated. One of the electrically insulating layer structures 104 (compare spacer 180) is seen as well. For instance, a dielectric paste or a pre-cut dielectric material such as prepreg may be used for forming the shown electrically insulating layer structure 104 with defined isolation distances. FIG. 3 furthermore illustrates that a high surface area of the electrically conductive layer structure 106a may directly contact the full upper surface of the components 108.

Referring to FIG. 4, a plan view of the layer corresponding to the second electrically conductive layer structure 106b is illustrated. Another one of the electrically insulating layer structures 104 is seen as well.

Referring to FIG. 5, a plan view of the layer corresponding to the third electrically conductive layer structure 106c is illustrated. Yet another one of the electrically insulating layer structures 104 (compare spacers 176) is seen as well.

Figure 6:
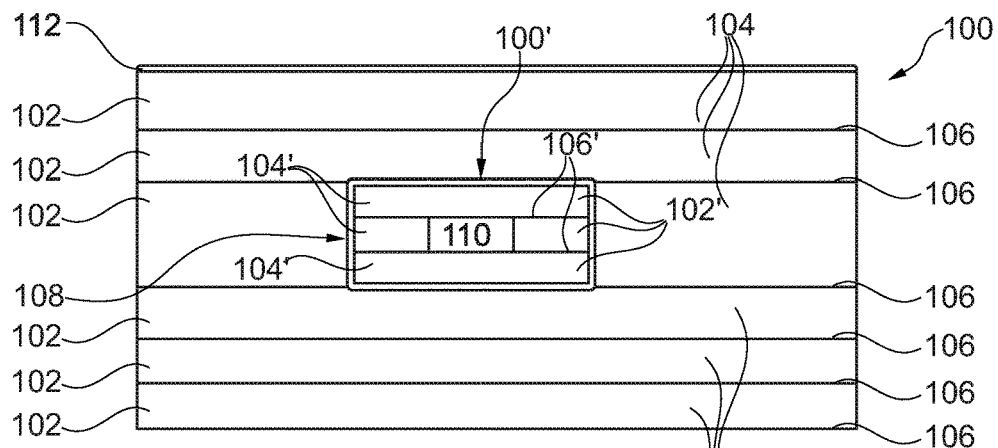
FIG. 6 shows a component carrier according to another exemplary embodiment in which a diode component which is embedded in the component carrier is, in turn, a naked die with diode function embedded in a further component carrier in a board-in-board configuration.

FIG. 6 shows a component carrier 100 according to another exemplary embodiment in which a diode component 108 which is embedded in the component carrier 100 is a naked die with diode 110 embedded, in turn, in a further interconnected stack 102' of a further component carrier 100' in a board-in-board configuration.

More specifically, the diode 110 may here be embodied as a naked semiconductor chip which is packaged in a printed circuit board laminate by laminating and embedding it within an interconnected stack 102' of one or more electrically insulating layer structures 104' (such as resin with reinforcing particles, in particular prepreg and/or FR4) and one or more electrically conductive layer structures 106' (such as patterned and/or continuous metallic layers, in particular copper foils). This further component carrier 100' may then function as a component 108 which is subsequently embedded within the interconnected stack 102 of the component carrier 100. Thereby, the further component carrier 100' serves as a further board embedded in the component carrier 100 serving as another board, so that a board-in-board configuration is obtained. The further interconnected stack 102' may provide an electric interconnection function and a mechanical protection function for the diode 110. In addition, the fact that the interconnected stack 102 and the further interconnected stack 102' may both be made of component carrier material laminate (for instance prepreg and copper) relaxes issues related to thermal mismatch and thermal tension due to different values of the coefficients of thermal expansion and different values of the Young modulus of constituents of the component carrier 100.

Figure 7:
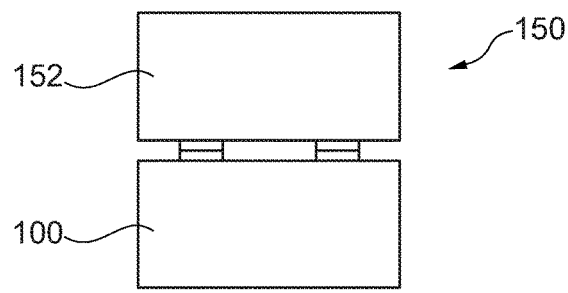
FIG. 7 illustrates an electronic device according to yet another exemplary embodiment in which a coupling structure is embodied as a further semiconductor component mounted on the component carrier functioning as IC substrate.

FIG. 7 illustrates an electronic device 150 according to yet another exemplary embodiment in which a coupling structure 152 is embodied as a further semiconductor component mounted on the component carrier 100 which is here functioning as IC (integrated circuit) substrate. In such an embodiment, a compact configuration is provided in which a rectifying function or another diode function may be supplied to the further semiconductor component as coupling structure 152 for which the component carrier 100 with integrated diode function additionally serves as a mechanical mounting base.

Figure 8:
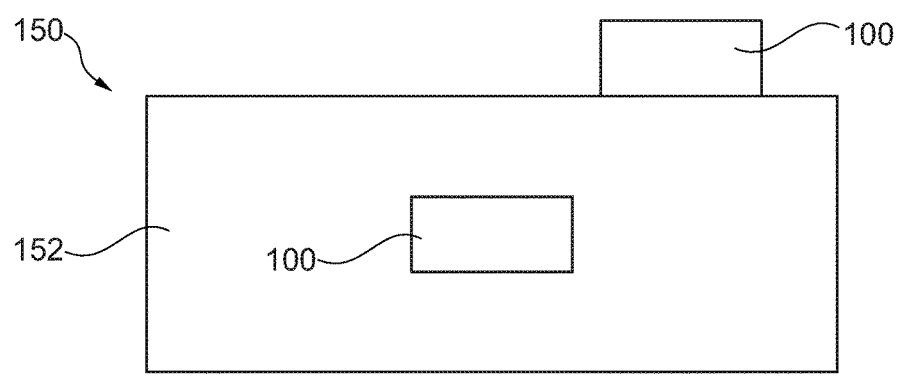
FIG. 8 illustrates an electronic device according to still another exemplary embodiment in which a coupling structure is a further larger component carrier in which the smaller component carrier with diode function is embedded in a board-in-board configuration.

FIG. 8 illustrates an electronic device 150 according to still another exemplary embodiment in which a coupling structure 152 is a further component carrier in which the component carrier 100 is embedded in a board-in-board configuration.

In the embodiment according to FIG. 8, one component carrier 100 (for instance the one shown in FIG. 1) may be embedded within a further laminated stack of component carrier material as coupling structure 152. As can be taken from FIG. 8, another component carrier 100 (for instance the one shown in FIG. 1) may be surface mounted on the further laminated stack constituting coupling structure 152. In a similar way as in FIG. 6, the board-in-board configuration according to FIG. 8 allows to use properly compatible materials for the embedded component carrier 100 and the embedding coupling structure 152. Thermal stress and other issues relating from the combination of materials of too different physical properties may therefore be efficiently suppressed. Thus, it is possible to mount a module as the one shown in FIG. 1 on or within a PCB or the like.

FIG. 9 is a circuit diagram of a rectifier bridge 190 composed of four interconnected components 108 each comprising a diode 110 according to the embodiment of FIG. 1. The rectifier bridge 190 is configured for converting an alternating voltage (see input voltage $U_{IN}$) into a direct voltage (see output voltage $U_{OUT}$).

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A component carrier, comprising:
   an interconnected stack comprising at least one electrically insulating layer structure and/or at least one electrically conductive layer structure;
   a component embedded in the interconnected stack and comprising a diode; and
   at least one heat removal layer configured for removing heat from the diode and substantially fully covering a whole main surface of the component carrier;
   wherein the at least one electrically conductive layer structure comprises a first electrically conductive layer structure which is arranged spaced with regard to an electrically conductive layer as one of the at least one heat removal layer by an electrically insulating and thermally conductive layer as another one of the at least one heat removal layer;
   wherein the first electrically conductive layer structure directly electrically contacts an entire first main surface of a respective one of a plurality of components.

2. The component carrier according to claim 1, further comprising at least one of the following features:
   wherein the component is a semiconductor chip in which the diode is monolithically integrated;
   wherein the component comprises a cathode pad on one main surface of the component, and an anode pad on an opposing other main surface of the component.

3. The component carrier according to claim 2, further comprising at least one of the following features:
   wherein the cathode pad covers the entire main surface of the component and/or the anode pad covers only part of the opposing other main surface of the component;
   wherein at least one of the cathode pad and the anode pad comprises or consists of a metal.

4. The component carrier according to claim 1, further comprising a plurality of components embedded in the interconnected stack and each comprising a respective diode.

5. The component carrier according to claim 4, further comprising at least one of the following features:
   wherein the components are electrically connected to form a rectifier bridge;
   wherein the components are located coplanar.

6. The component carrier according to claim 1, wherein the at least one electrically conductive layer structure comprises a second electrically conductive layer structure which is arranged spaced with regard to the first electrically conductive layer structure at least by the component and one of the at least one electrically insulating layer structure.

7. The component carrier according to claim 6, further comprising at least one of the following features:
   wherein the second electrically conductive layer structure electrically contacts only a part of a second main surface of the component, a plurality of sections each electrically contacting a respective part of the second main surface of a respective one of a plurality of components;
   a plurality of first vertical interconnect structures directly contacting both the second electrically conductive layer structure and the part of the second main surface of the component, wherein at least one of the first vertical interconnect structures, the at least one second vertical interconnect structure and the third vertical interconnect structures comprises at least one of the group consisting of a metal filled laser drill hole, a metal filled mechanical drill hole, a metallic inlay, and a micro-via;
   at least one second vertical interconnect structure directly contacting both the first electrically conductive layer structure and the second electrically conductive layer structure.

8. The component carrier according to claim 1, wherein the at least one electrically conductive layer structure comprises a third electrically conductive layer structure forming at least part of another main surface of the component carrier opposing the main surface formed by the at least one heat removal layer comprising solder material on the third electrically conductive layer structure.

9. The component carrier according to claim 8, further comprising at least one of the following features:
   wherein the third electrically conductive layer structure is a patterned electrically conductive layer composed of a plurality of electrically decoupled separate islands;
   a plurality of third vertical interconnect structures directly contacting both the second electrically conductive layer structure and the third electrically conductive layer structure.

10. The component carrier according to claim 1, further comprising at least one of the following features:
    wherein the at least one heat removal layer comprises or consists of an electrically conductive material having a value of thermal conductivity of at least 50 W/mK;
    wherein the at least one heat removal layer comprises or consists of an electrically insulating material having a value of thermal conductivity of at least 3 W/mK;
    wherein the component comprises a further interconnected stack comprising at least one further electrically insulating layer structure and/or at least one further electrically conductive layer structure in which the diode is embedded so that the component and the stack form a board-in-board array;

wherein the at least one heat removal layer comprises or consists of a material of the group consisting of copper, aluminum, diamond-like carbon, graphene, highly thermally conductive prepreg, and a resin filled with thermally highly conductive filler particles;

wherein the at least one electrically conductive layer structure comprises at least one of the group consisting of copper, aluminum, nickel, silver, gold, palladium, and tungsten, any of the mentioned materials being optionally coated with supra-conductive material;

wherein the at least one electrically insulating layer structure comprises at least one of the group consisting of resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide; shaped as a plate;

wherein the component carrier is configured as one of the group consisting of a printed circuit board, and a substrate.

11. An electronic device, comprising:

a coupling structure;

a component carrier having an interconnected stack formed with at least one electrically insulating layer structure and/or at least one electrically conductive layer structure, a component embedded in the interconnected stack and having a diode, and at least one heat removal layer arranged to remove heat from the diode and substantially fully covering a main surface of the component carrier, the component carrier mechanically connected with the coupling structure so that the diode is electrically coupled to the coupling structure;

wherein the at least one electrically conductive layer structure comprises a first electrically conductive layer structure which is arranged spaced with regard to an electrically conductive layer as one of the at least one heat removal layer by an electrically insulating and thermally conductive layer as another one of the at least one heat removal layer;

wherein the first electrically conductive layer structure directly electrically contacts an entire first main surface of a respective one of a plurality of components.

12. The electronic device according to claim 11, further comprising at least one of the following features:

the electronic device is configured as at least one of the group consisting of a mains adapter, a rectifier, a DC/DC converter, and a power electronic device;

a heat sink body thermally coupled to the at least one heat removal layer;

wherein the coupling structure is selected from a group consisting of a further component carrier on which the component carrier is mounted, a further component mounted on the component carrier, and a further component carrier in which the component carrier is embedded;

wherein the diode is electrically coupled to the coupling structure at a main surface of the component carrier opposing the at least one heat removal layer.

13. A method of manufacturing a component carrier, comprising:

forming an interconnected stack of at least one electrically insulating layer structure and/or at least one electrically conductive layer structure;

embedding a component, which comprises a diode, in the interconnected stack; and substantially fully covering a whole main surface of the component carrier by at least one heat removal layer configured for removing heat from the diode;

wherein the at least one electrically conductive layer structure comprises a first electrically conductive layer structure which is arranged spaced with regard to an electrically conductive layer as one of the at least one heat removal layer by an electrically insulating and thermally conductive layer as another one of the at least one heat removal layer;

wherein the first electrically conductive layer structure directly electrically contacts an entire first main surface of a respective one of a plurality of components.

* * * * *